(12) United States Patent
Zhao et al.

(10) Patent No.: US 8,635,576 B2
(45) Date of Patent: Jan. 21, 2014

(54) METHOD FOR DETERMINING WIRE LENGTHS BETWEEN NODES USING A RECTILINEAR STEINER MINIMUM TREE (RSMT) WITH EXISTING PRE-ROUTES ALGORITHM

(75) Inventors: Min Zhao, College Station, TX (US); Jingyan Zuo, San Jose, CA (US); Yu-Yen Mo, San Jose, CA (US)

(73) Assignee: Oracle International Corporation, Redwood Shores, CA (US)

( * ) Notice: Subject to any disclaimer, the term of this patent is extended or adjusted under 35 U.S.C. 154(b) by 0 days.

(21) Appl. No.: 13/486,061

(22) Filed: Jun. 1, 2012

(65) Prior Publication Data

US 2013/0086534 A1   Apr. 4, 2013

Related U.S. Application Data

(60) Provisional application No. 61/541,171, filed on Sep. 30, 2011.

(51) Int. Cl.
*G06F 17/50* (2006.01)

(52) U.S. Cl.
USPC ............................ 716/126; 716/116; 716/119

(58) Field of Classification Search
USPC .......................................... 716/116, 119, 126
See application file for complete search history.

(56) References Cited

U.S. PATENT DOCUMENTS 7,117,468 B1 * 10/2006 Teig et al. ...................... 716/129
7,961,642 B2 * 6/2011 Agrawal et al. ............... 370/252

OTHER PUBLICATIONS

International Search Report and Written Opinion in application No. PCT/US2012/057454 mailed Dec. 13 2012 pp. 1-11.
Yen-Hung Lin, et al "Critical-Trunk-Based Obstacle-Avoiding Rectilinear Steiner Tree Routings and Buffer Insertion for Delay and Slack Optimization" IEEE Transactions on Computer Aided Design of Integrated Circuits and Systems, vol. 30, No. 9, Sep. 1, 2011. pp. 1335-1348.
Christopher S Helvig, et al "New Approximation Algorithms for Routing with Multiport Terminals" IEEE Transactions on Computer Aided Design of Integrated Circuits and Systems, vol. 19, No. 10 Oct. 1, 2000 pp. 1-12.
Mehmet Can Yildiz, et al: "Preferred Direction Steiner Trees" IEEE Transactions on Computer Aided Design of Integrated Circuits and Systems, vol. 21, No. 11, Nov. 1 2002, pp. 1-6.
Jason Cong, et al "Efficient Algorithms for the Minimum Shortest Path Steiner Arborescence Problem with Applications to VLSI Physical Design" IEEE Transactions on Computer Aided Design of Integrated Circuits and Systems, vol. 17, No. 1, Jan. 1998 pp. 1-16.

* cited by examiner

*Primary Examiner* — Thuan Do
(74) *Attorney, Agent, or Firm* — Meyertons Hood Kivlin Kowert & Goetzel; Stephen J. Curran

(57) ABSTRACT

A method for the creation of rectilinear Steiner minimum trees includes determining a set of candidate connections from a terminal node to a different terminal node or to a graph edge. The length of each candidate connection may be used to determine the set of candidate connections that span the graph with a minimum total length.

21 Claims, 13 Drawing Sheets

| Iteration | Node List (V) | Edge set (E) |
|---|---|---|
| 0 | A,B,C,D | |
| 1 | C,D | (A,B) |
| 2 | D | (A,B),(B,C) |
| 3 | | (A,B),(B,C),(C,D) |

*FIG. 3*

| Iteration | Node List (V) | Edge set (E) |
|---|---|---|
| 0 | B,C,D | (A,H) |
| 1 | C,D | (A,H),(A,B) |
| 2 | D | (A,H),(A,B),(B,C) |
| 3 |  | (A,H),(B,C),(G,D),(A,G),(G,B) |

*FIG. 5*

| Iteration | Node List (V) | Edge set (E) |
|---|---|---|
| 0 | B,C,D,E | (A,H) |
| 1 | C,D,E | (A,H),(A,B) |
| 2 | D,E | (A,H),(A,B),(B,C) |
| 3 | D | (A,H),(B,C),(A,F),(B,F),(E,F) |
| 4 |  | (A,H),(B,C),(A,F),(B,F),(E,F),(C,D) |

*FIG. 7*

METHOD FOR DETERMINING WIRE LENGTHS BETWEEN NODES USING A RECTILINEAR STEINER MINIMUM TREE (RSMT) WITH EXISTING PRE-ROUTES ALGORITHM

PRIORITY CLAIM

This application claims benefit of priority of U.S. Provisional Patent Application No. 61/541,171, filed Sep. 30, 2011, which is incorporated by reference herein in its entirety.

BACKGROUND

1. Technical Field

This disclosure relates to integrated circuit design, and more particularly to physical routing of wires on integrated circuits.

2. Description of the Related Art

In modern integrated circuit design, wire routing and wire length has become of paramount importance as device geometries continue to shrink. Accordingly, in an effort to use the shortest wire lengths possible, electronic design automation tools have been developed to optimize wire lengths in complex circuit designs.

In the realm of physical wire routing it is sometimes necessary to interconnect a number of nodes using the shortest wire lengths. Mathematically, this problem may be stated in terms of determining the minimum Steiner tree of a graph. As such, much work has been done to create algorithms that use variants of the Steiner tree. More particularly, there have been several algorithms developed that solve a rectilinear Steiner minimum tree (RSMT) problem.

These conventional RSMT algorithms solve the wire length problem using a variety of techniques. For example, one such rectilinear Steiner minimum tree technique is known a fast look up table estimation (FLUTE), which uses a pre-computed look up table. Another conventional technique is known as a node-breaking technique. These conventional techniques can accurately create an RSMT construction. However, they do have drawbacks. For example, when using look up tables there is inflexibility, particularly in designs that have pre-routes, or routes that have been routed by the designer ahead of time. In addition, some conventional RSMT algorithms do not easily accommodate sink-driver constraints.

SUMMARY OF THE EMBODIMENTS

The present disclosure provides systems and methods for generating rectilinear Steiner minimum trees. To that end, systems and methods disclosed herein provide the expression of algorithms that allow the creation of rectilinear Steiner minimum trees from existing graph data.

In a non-limiting embodiment, the algorithm may receive a graph which includes a set of terminal nodes and a set of edges. A set of candidate connections between the set of terminal node and the set of edges and a distance may be calculated for each candidate connection. Candidate connections which include a given terminal node may be stored in a memory location (a "node heap") specific to the given terminal node. The node heap for each terminal node may be examined to determine the candidate connection with the smallest distance for the terminal node. The minimum candidate connections for each terminal node may be assembled to form a minimum Steiner tree.

In one implementation, the graph may be representative of a possible wire route in a semiconductor design, and include one or more pre-defined connections (e.g., a "pre-route") and the calculated distance may be the rectilinear distance between terminal nodes. In some embodiments, the distance associated with a pre-route, may be equal to zero.

In another non-limiting embodiment, the algorithm may add one or more Steiner nodes to the graph that may allow the connection of a terminal node to a generated connection or one of the pre-defined connections.

BRIEF DESCRIPTION OF THE DRAWINGS

FIG. 3 is a table illustrating the node and edge lists generated while routing the graph depicted in FIG. 2.

FIG. 5 is a table illustrating the node and edge lists generated while routing the graph depicted in FIG. 4.

FIG. 7 is a table illustrating the node and edge lists generated while routing the graph depicted in FIG. 6.

Figure 1:
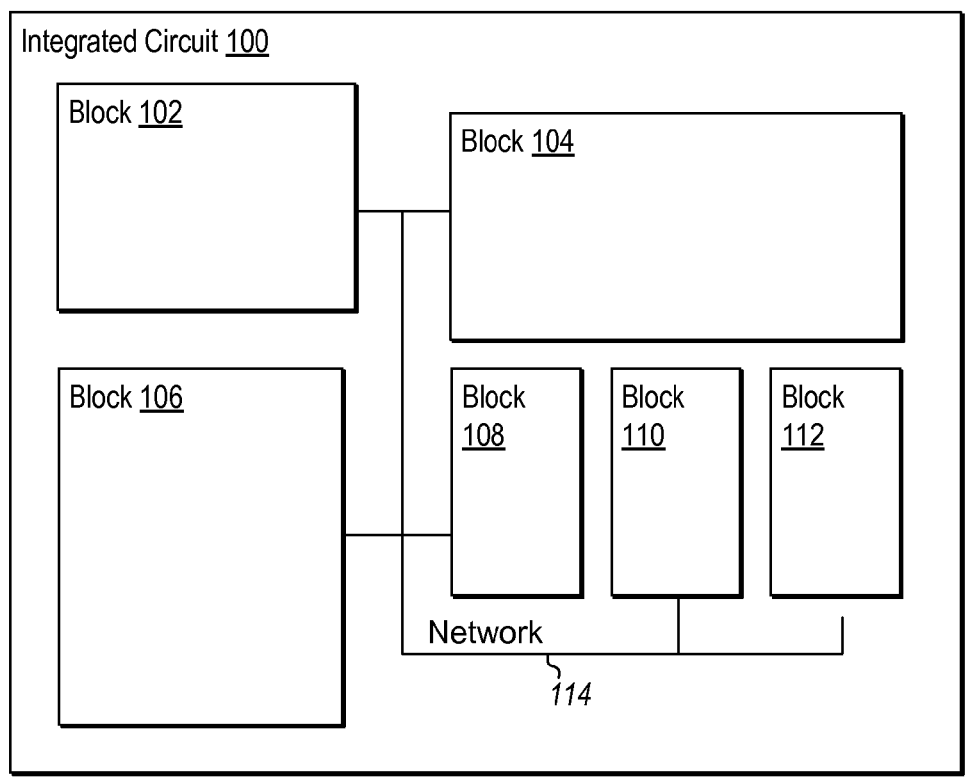
FIG. 1 is a block diagram of one embodiment of an integrated circuit.

Specific embodiments are shown by way of example in the drawings and will herein be described in detail. It should be understood, however, that the drawings and detailed description are not intended to limit the claims to the particular embodiments disclosed, even where only a single embodiment is described with respect to a particular feature. On the contrary, the intention is to cover all modifications, equivalents and alternatives that would be apparent to a person skilled in the art having the benefit of this disclosure. Examples of features provided in the disclosure are intended to be illustrative rather than restrictive unless stated otherwise.

As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/ components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six, interpretation for that unit/circuit/component.

DETAILED DESCRIPTION OF EMBODIMENTS

Interconnect wiring in modern integrated circuits (ICs) may affect both performance and power. A wire in an IC may be constructed from a metal such as, e.g., aluminum or copper, or from polycrystalline silicon (commonly referred to as "polysilicon") and the inherent resistance, inductance, and capacitance of the wire may limit the performance of an IC by bounding the rate at which the wire may be charged and discharged. With the geometries of semiconductor processes continuing to shrink, the distance between adjacent wires is reducing contributing to increased coupling (both capacitive and inductive) between adjacent wires. Increased coupling between adjacent wires may result in higher levels of signal cross talk, i.e., a transition on a wire inducing an unwanted transition on an adjacent wire, resulting in extra power consumption or a logic failure. Techniques to provide optimal wiring on an IC are essential to maintain power and performance goals. The embodiments described below may illustrate some techniques for routing wires.

A block diagram of an embodiment of an integrated circuit is illustrated in FIG. 1. IC 100 includes a number of circuit blocks (e.g., 102, 104, 106, 108, 110, and 112) and an interconnection network 114 which couples together the various circuit blocks. In some embodiments, the circuit blocks may include memories such as, e.g., static random-access memories (SRAMs), mixed-signal analog circuits such as, e.g., phase-locked loops (PLLs), or a central processing unit (CPU) which may implement any suitable instruction set architecture (ISA), such as, e.g., the ARM™, PowerPC™, SPARC™ or x86 ISAs, or combination thereof.

Circuit blocks 102, 104, 106, 108, 110, and 112 may be constructed by different methods. In some embodiments, the blocks may be "full custom" designs where a circuit designer and a layout designer collaborate to create the circuits and mask design artwork used to create the photomasks necessary to fabricate the circuit block. In other embodiments, the blocks may be created from a software description of the circuit block's functionality using a language such as, e.g., Verilog or VHDL. The software description may be compiled and synthesized into instances of logic gates from a standard cell library. The placement of the logic gates and wiring interconnect between the logic gates may then be optimized through a process commonly referred to as "place and route."

In some embodiments of IC 100, the interconnect network 114 may include thousands of individual nets and sub-networks. In such cases, it may be impractical for the connections to be performed by a circuit or chip designer. Instead, an electronic design automation (EDA) tool may be used. In one embodiment, as described in greater detail below, the EDA tool may implement a rectilinear Steiner minimum tree (RSMT) algorithm to route the wires. To implement the RSMT algorithm, the EDA tool may represent each route as a graph and then determine a minimum Steiner tree based on the RSMT algorithm. The minimum Steiner tree may include a list of edges that connect all the vertices of the graph such that, the sum of the distances between all the vertices along the specified edges is minimized.

It is noted that a graph is a mathematical abstraction that connects a set of vertices through a series of links (also referred to as "edges"). In some embodiments, the vertices may represent the terminal nodes of a route that may be representative of a route included in interconnect network 114, and the links may represent the rectilinear distance between the terminal nodes. In other embodiments, the links may represent a cost between vertices. The cost may include the rectilinear distance between the vertices and a measure of route congestion between the vertices. In cases where the links or edges have associated costs, the graph may be referred to as a "weighted graph."

It is further noted that a tree is a graph in which some of the vertices of the graph of are connected by a single simple path, i.e., a tree is a graph that contains no closed paths. A spanning tree is a tree that includes all of the vertices of the graph.

In some embodiments, certain signals in IC 100 may have special requirements. For example, it may be desirable to keep the system clock for IC 100 isolated from other signals. To accomplish the isolation, the use of wires at ground potential running adjacent to the system clock (commonly referred to as "shields") may be required or the isolation may require the system clock to follow a specific path on IC 100 so the system clock may avoid undesirable coupling to noisy signals. When a signal needs to follow a specific path, or has special performance needs, all or part of the signal's path may be determined by a circuit or chip designer prior to the application of the EDA tool's routing algorithm. Signals whose paths are determined by a circuit or chip designer are commonly referred to as "pre-routes." In some embodiments, the circuit or chip designer may specify that all or a portion of a signal's path be implemented on a specific wiring layer of a semiconductor manufacturing process.

Information indicative of a pre-route's path, such as, e.g., a wiring layer to be used for the pre-route, may be passed to the EDA tool. Additionally, edges may be added to the edge set that may force the EDA tool to follow a desired path for some portion of the tree that spans the graph. In some embodiments, the cost associated with a pre-route may be zero. In other embodiments, a route solution from an iteration of operation of the EDA tool may be used as pre-route information for a subsequent iteration of operation of the EDA tool.

Figure 2:
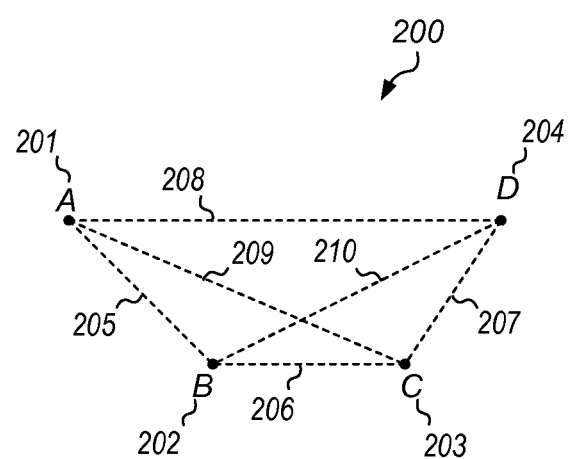
FIG. 2 illustrates an embodiment of a graph for a route.

FIG. 2 illustrates an embodiment of a graph for a route that may be representative of an individual route of interconnect network 114 in IC 100. Graph 200 includes terminal nodes A 201, B 202, C 203, D 204, and distances 205, 206, 207, 208, 209, and 210. A minimum spanning tree for graph 200 may be determined using Prim's minimum spanning tree algorithm as shown below in the example code segment. Prim's algorithm determines for each terminal node, the nearest terminal node to the currently selected terminal node, and in the process, determines a set of edges that form a spanning tree for the graph.

Prim's Minimum Spanning Tree Algorithm

```
Input: a set of nodes V, with a source v_s ∈ V
Output: a set of edges E that span V
    For each node v_i ∈ V
        D_vtree(v_i) = D(v_i,v_s), π(v_i) ← v_s
        Remove v_s from V
        While V is not empty {
            v_new ← node in V with min D_vtree
            Add edge (v_new,π(v_new)) to E
            Remove v_new from V
            For each node v j ∈ V
                D(v_new,v_j) ← distance between v_new and v_j
```

-continued

```
        If D(v_new,v_j)< D_vtree(v_j)
        D_vtree(v_j) = D(v_new,v_j),π(v_j) ← v_new
}
```

The progress of the applying Prim's minimum spanning tree algorithm may be monitored by examining the state of the node list V and the edge set E. Accordingly, in FIG. 3 a table illustrating the node list and edge set through the iterations of the algorithm is shown. Referring collectively to the algorithm in the code segment above, graph 200 of FIG. 2, and the table illustrated in FIG. 3, before the algorithm starts (iteration 0), the node list includes terminal nodes A 201, B 202, C 203, and D 204, and the edge list is empty. The algorithm may start with any terminal node. For the purposes of illustration, terminal node A 201 will be initially selected. The distances between terminal node A 201 and the other terminal nodes are then examined (e.g., the distance from terminal node A 201 to terminal node C 203 is distance 209). For the purposes of illustration, it is assumed that distance 205 less than distance 208 and distance 209. Since distance 205 is the shortest distance from terminal node A 201 to any of the terminal nodes, it is selected.

Distance 205 represents the distance between terminal node A 210 and terminal node B 202. The edge (A,B) is added to the edge set and terminal nodes A 201 and B 202 are removed from the node list.

With terminal nodes A 201 and B 202 removed from the node list, the algorithm then selects terminal node C 203. The distance from terminal node C 203 is then calculated to each of the other terminal nodes. In this example, distance 206 is less than distance 209 and distance 207, so the edge (B,C) from terminal node C 203 to terminal node B 202 is added to the edge list and terminal node C 203 is removed from the node list as shown in the iteration 2 entry in the chart illustrated in FIG. 3. With only terminal node D 204 remaining in the node list, the distances between terminal node D 204 and the other terminal nodes are calculated. In this example, distance 207 is less than distance 210 and distance 208, so the edge (C,D) is added to the edge list and terminal node D 204 is removed from the node list as shown in iteration 3 of the chart illustrated in FIG. 3. The algorithm then completes when all terminal nodes have been processed. The edge set {(A,B), (B,C), (C,D)} spans, i.e., connects all vertices of the graph, and the sum of the distances corresponding to each edge result in a minimum value. It is noted that in other embodiments of graph 200, different distances between the terminal nodes may result in a different edge set.

Figure 4:
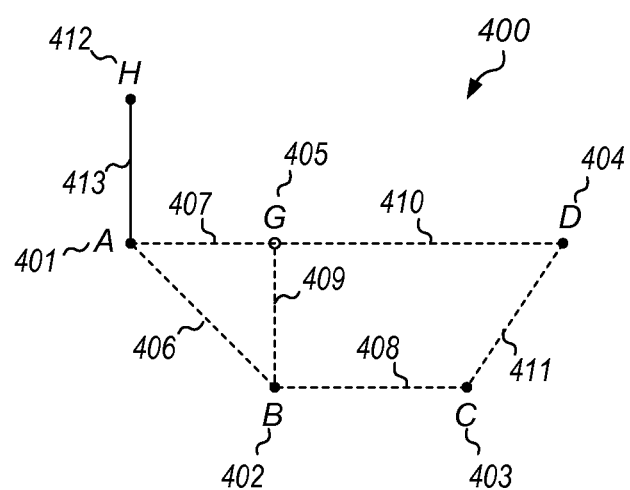
FIG. 4 illustrates an embodiment of a graph for a route with a pre-routed edge and a Steiner node.

FIG. 4 illustrates an alternative embodiment of a graph for a representative route of network 114 in IC 100. The illustrated embodiment includes terminal nodes A 401, B 402, C 403, D 404, and H 412, and distances 406, 407, 408, 409, 410, 411, and 413. Additionally, the embodiment includes Steiner node G 405. Trees that contain Steiner nodes are commonly referred to as "Steiner trees." It is noted that a Steiner tree may include one or more intermediate nodes or edges that reduced the length of the tree that spans a graph. In some embodiments, the Steiner nodes may correspond to natural "bends" in wires that result from the need for the wires to exist within a rectilinear grid that satisfies the design rules of a semiconductor process.

As described above in conjunction with the description of the embodiment illustrated in FIG. 2, the progress of the rectilinear Steiner minimum tree algorithm can be tracked by examining the contents of the node list and the edge set. FIG. 5 is a table illustrating the contents of the node list and edge set when the algorithm shown above in the example code segment is applied to graph 400. Referring collectively to the example code segment, graph 400 of FIG. 4, and the table illustrated in FIG. 5, the operation begins, as depicted in iteration 0 of the algorithm, with the edge list including the edge (A,H) due to it being defined as a pre-route. With terminal nodes A 401 and H 412 already included in the pre-route, the node list contains terminal nodes B 402, C 403 and D 404.

During the next iteration, terminal node B 402 is selected and the distances calculated between terminal node B 402 and the other terminal nodes. In this example, the distance 406 is the smallest distance, so edge (A,B) is added to the edge list and terminal node B 402 is removed from the node list as shown in iteration 1 of the chart depicted in FIG. 5. In the next iteration, the distances between terminal node C 403 and the other terminal nodes are calculated. In this example, distance 408 is shortest distance from terminal node C 403 to another node, so edge (B,C) is added to the edge list and terminal node C 403 is removed from the node list as shown in iteration 2 of the chart depicted in FIG. 5. In the final iteration, terminal node D 404 is selected and the minimum distance to another terminal node is determined to be the distance to terminal node A 401 through Steiner node G 405. This connection adds edges (A,G) and (G,B) to the edge set, replacing edge (A,B). With all of the terminal nodes processed, the algorithm is complete and with the final edge set {(A,H), (B,C), (G,D), (A,G), (G,B)} as shown in iteration 3 of the chart depicted in FIG. 5. In other embodiments, different Steiner nodes may be used resulting in a different final edge set.

Figure 6:
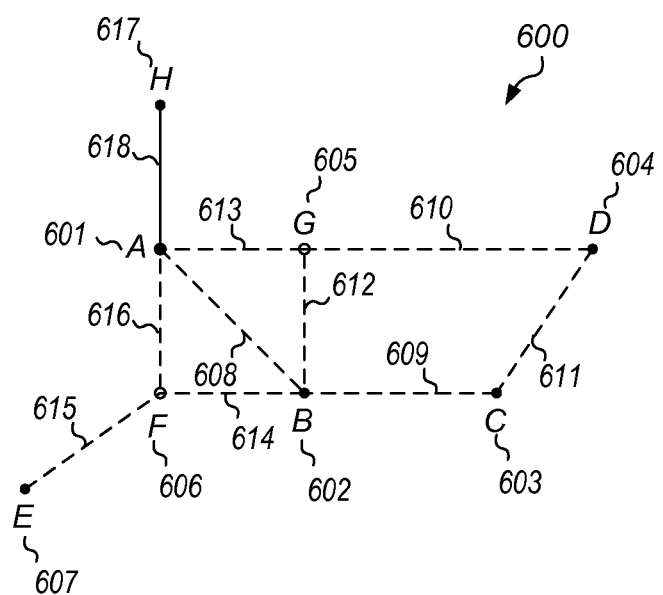
FIG. 6 illustrates an embodiment of a graph for a route with a pre-routed edge.

FIG. 6 illustrates an alternative embodiment of a graph for a representative route of network 114 in IC 100 of FIG. 1. The graph 600 includes terminal nodes A 601, B 602, C 603, D 604, E 607, and H 617, distances 608, 609, 610, 611, 612, 613, 614, 615, and 616, and pre-route 618. It is noted that in some embodiments, pre-route 618 may not connect to any of terminal nodes A 601, B 602, C 603, D 604, E 607 and H 617. For example, pre-route 618 may correspond to all or a portion of a metal layer above or below terminal nodes A 601, B 602, C 603, D 604, E 607 and H 617, and may not be connected the aforementioned terminal nodes, but may be used to determine a minimum spanning tree. Additionally, graph 600 includes Steiner nodes G 605 and F 606. With the inclusion of pre-route 618 and Steiner nodes G 605 and F 606, Prim's basic algorithm is incapable of determining a minimum spanning tree. An example of an algorithm to determine a minimum spanning tree that includes pre-routes and Steiner nodes is shown below in the example code segment and will be described in more detail in conjunction with the description of the flowchart illustrated in FIG. 8.

Rectilinear Steiner Minimum Tree (with Pre-Routes) Construction Algorithm

```
Input:      V (a set of all nodes),
            E_pre-route (a set of pre-routed edges)
Output:     E_RSMT (all edges of steiner tree)
Initialize E_add = E_pre-route, E_RSMT = E_pre-route
Do {
    For each edge ee in E_add
        For each node n in V
            Get cand{D(n,ee),E_new,eold} = dist(n,ee)
            If D(n,ee)< minDefinite(n)
                Push cand into heap of node n
                If cand < minCand, minCand = cand
                If cand{D(n,ee),Enew,eold} is "definite"
                    minDefinite(n) = D(n,ee)
        End node iteration
    End edge iteration
```

-continued

```
success=0; set E_add empty
while(success==0) {
    if ee of minCand{D(n,ee),E_new,e_old} exist {
        remove n from V
        add E_new to E_RSMT
        add E_new to E_add
        remove e_old from E_RSMT
        success=1
    } else {
        go through all node heaps to get minCand
    }
} while V is not empty
```

FIG. 7 is a table illustrating the contents of the node list and edge set when the rectilinear Steiner minimum tree (RSMT) construction algorithm is applied to graph 600. Referring collectively to graph 600, the code segment above, and the table illustrated in FIG. 7, the operation begins, as depicted in iteration 0 of the RSMT construction algorithm, with the edge list including the edge (A,H) due to it being defined as a pre-route. Starting with terminal node B 602, distance 608 is the minimum distance to another node, so edge (A,B) is added to the edge list and terminal node B 602 is removed from node list (V) as shown in iteration 1 of the table depicted in FIG. 7. Terminal node C 603 is then selected and the process repeated resulting in edge (B,C) being added to the edge set and terminal node C 603 being removed from node list (V) as shown in iteration 2 of the table illustrated in FIG. 7.

The two potential connections (terminal node D 604 and Steiner node G 605, and terminal node E 607 to Steiner node F 606) each make use of a different Steiner node. The choice of which Steiner node to use will affect the other possible connection. When possible connections affect each other in this fashion, the connections are referred to as being "conflicting." In this example, the distance of 615 is less than the distance of 610, resulting in the use of Steiner node F 606 which adds edges (A,F) and (E,F) to the edge list. The inclusion of Steiner node F 606 in the spanning tree solution, however, invalidates edge (A,B) which is replaced by edges (A,F) and (B,F) as shown in iteration 3 of the chart illustrated in FIG. 7.

The removal of edge (A,B) then prevents the previously considered connection between terminal node D 604 and terminal node A 601 through Steiner node G 605 from being added to the edge set. Instead, terminal node D 604 must be added to the spanning tree via a connection to terminal node C 603, resulting in the final edge set {(A,H), (B,C), (A,F), (B,F), (E,F), (C,D)} as shown in iteration 4 of the chart depicted in FIG. 7. It is noted that in other embodiments, different methods of dealing with conflicting connections is possible and contemplated.

Figure 8:
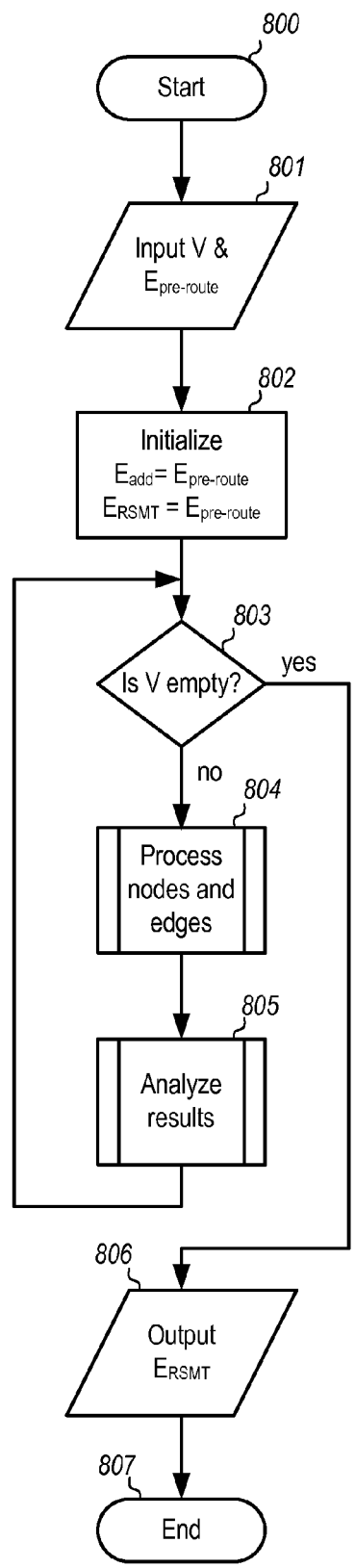
FIG. 8 is a flowchart illustrating an embodiment of an algorithm to build rectilinear Steiner minimum tree.

Turning to FIG. 8, a flowchart of an embodiment of the RSMT construction algorithm as depicted in the above example code segment is illustrated. The operation begins in block 800. A node list (V) and a pre-route edge set ($E_{pre-route}$) are received as input in block 801. In block 802, two edge sets, $E_{add}$ and $E_{RSMT}$, are initialized to contain the elements of $E_{pre-route}$. The operation then depends on the number of elements in the node list V (block 803). When node list V is empty, the edge set of the RSMT ($E_{RSMT}$) is output (block 806) and then the operation ends (block 807). When node list V is not empty, the nodes and edges of a graph defined by V and $E_{pre-route}$ are processed (block 804) as will be described in more detail below in conjunction with the description of FIG. 9. The results of operation perform in block 804 are then analyzed (block 805) as will be described in reference to FIG. 10, and then the number of nodes in the node list V is checked (block 803). It is noted that in the illustrated embodiment, some or all of operations may occur in a different order than shown, or may occur concurrently rather than sequentially.

Figure 9:
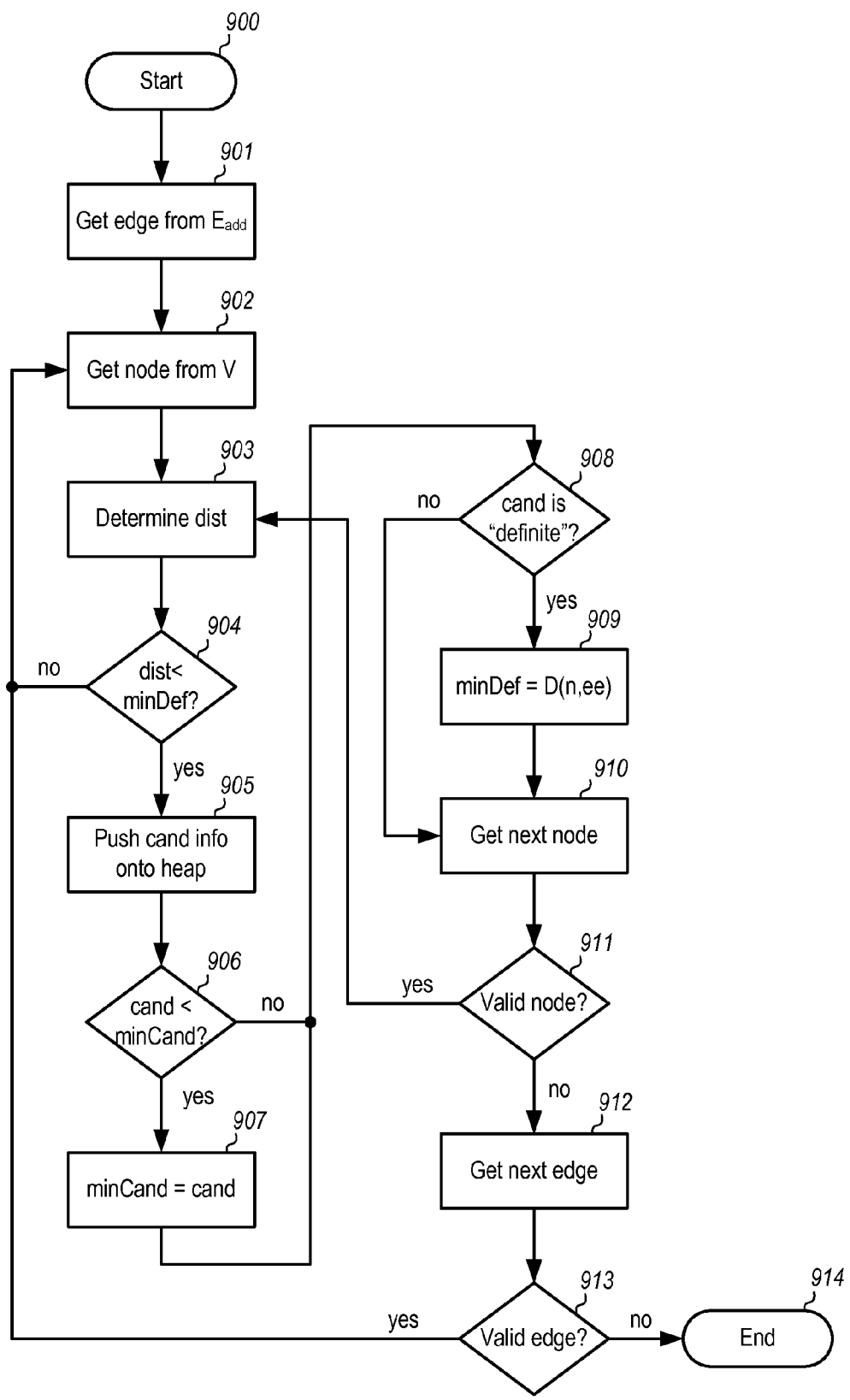
FIG. 9 illustrates an embodiment of an algorithm for processing nodes and edges of a graph.

As described above in the description of block 804 of FIG. 8, a portion of the embodiment of the RSMT algorithm is illustrated in FIG. 9. Beginning in block 900, an edge ee is then selected from $E_{add}$ (block 901). In some embodiments, $E_{add}$ may be initialized to contain a pre-route edge set as illustrated in block 802 of FIG. 8. A node n is then selected from node list V (block 902). A cost D between node n and edge ee is then calculated (block 903) for a candidate connection. As previously described, the cost may include the rectilinear distance between node n and edge ee. In other embodiments, the cost may also include a measure of route congestion. The operation then depends on a comparison between the cost D and a variable minDefinite (block 904). In some embodiments, the variable minDefinite is initialized to the largest number a computer can store. When cost D is greater than or equal to the variable minDefinite, a new node is selected from node list V (block 902).

When the cost D is less than the variable minDefinite, the information for the candidate connection is stored on the heap for the node n (block 905). The operation then depends on a comparison between the candidate connection information and a minCand variable (block 906). When the cost of a candidate connection is less than the cost stored in the minCand variable, the minCand variable is updated with the candidate connection information (block 907). The operation then depends on a check to determine if the candidate connection is definite (block 908). When the candidate connection is greater than or equal to the minCand variable, the operation also then depends on the check to determine if the candidate connection is definite (block 908). When the candidate connection is definite, the minDefinite variable is updated to contain the cost between the currently selected edge ee and node n (block 909). An attempt is then made to select another node (block 910). When the candidate connection is not definite, an attempt is then made to select another node (block 910).

The operation then depends on if a valid node was returned from the selection process (block 911). When a valid new node is selected, a new cost between the new node and the current edge is calculated (block 903). When the selection process does not return a valid new node, all of the nodes have been processed, and an attempt is made to select a new edge (block 912). The operation then depends on whether or not a valid new edge was returned from the selection process. When a valid new edge was returned from the selection process, the node selection process begins again (block 902). When the selection process does not return a valid new edge, all of the edges have been processed, and the operation completes (block 914). It is noted that in other embodiments, different variable names may be used and the operations illustrated may be performed in a different order.

Figure 10:
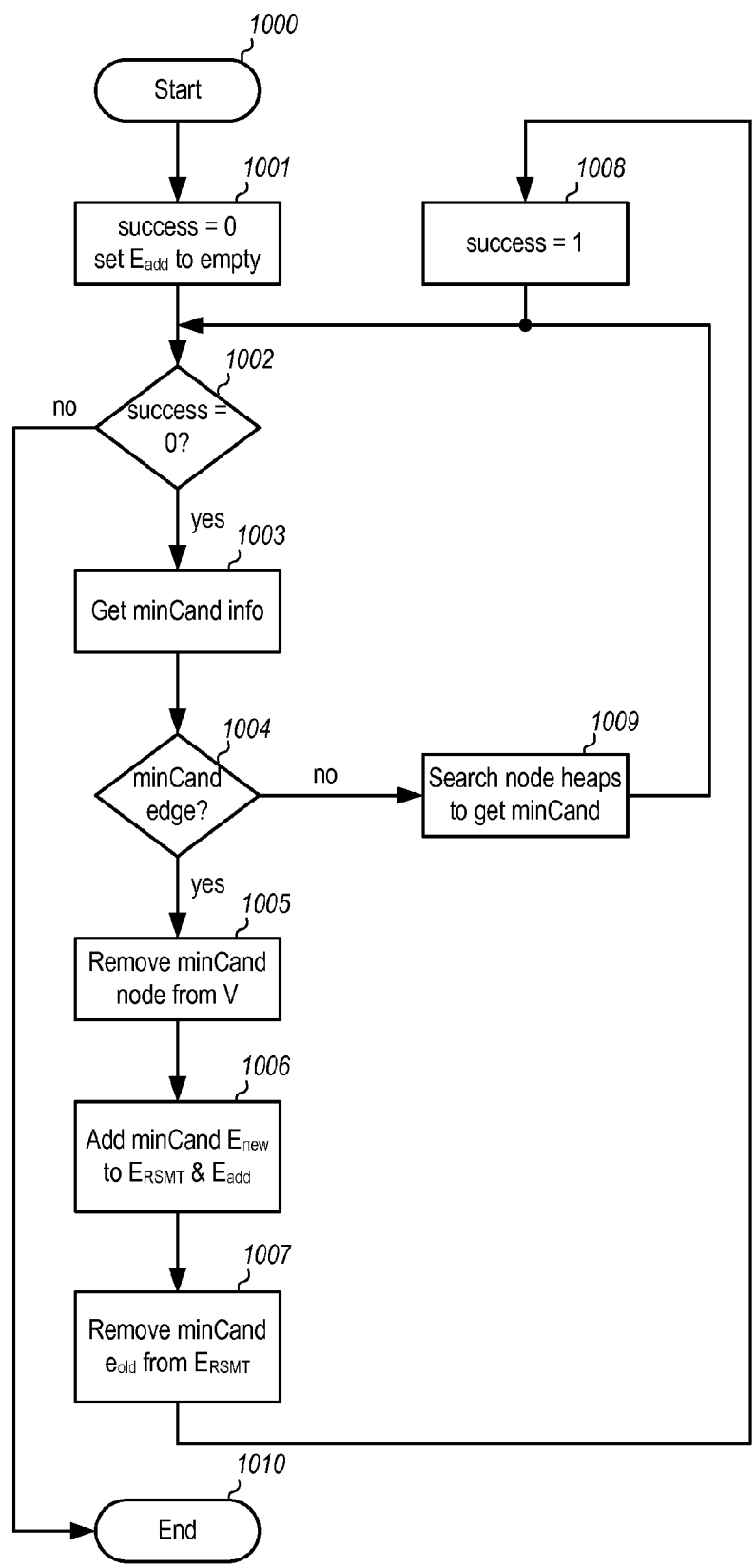
FIG. 10 illustrates an embodiment of an algorithm for analyzing the results of the node and edge processing depicted in FIG. 9.

As described above in the description of block 805 of FIG. 8, a portion of the RSMT algorithm is depicted in the flowchart illustrated in FIG. 10. The operation begins in block 1000. A success variable may be initialized to zero, and the variable $E_{add}$ may be emptied (block 1001). The operation then depends on the value of the success variable (block 1002). When the success variable is equal to one, the operation ends (block 1010). When the success variable is equal to zero, information on the connection stored in the minCand variable may be obtained (block 1003). The operation then depends on if there edge information exits for the connection stored in the minCand variable (block 1004). When no edge information is available, other node heaps may be searched for another possible candidate connection (block 1009). In some embodiments, the node heaps may by the result of the operation illustrated in block 905 of FIG. 9. The value of the success variable may then be checked (block 1002).

When an edge exists for the connection stored in the min-Cand variable, the node included as part of the connection is removed from the node list V (block 1005). The $E_{new}$ edge stored in the minCand variable is then stored in the $E_{RSMT}$ edge set and the $E_{add}$ edge set (block 1006). The $e_{old}$ edge stored in the minCand variable is then removed the $E_{RSMT}$ edge set (block 1007). The value of the success variable is set equal to one (block 1008) and the value of the success variable is then checked (block 1002). It is noted that in other embodiments, other arrangements of variables and operations are possible and contemplated.

Figure 11:
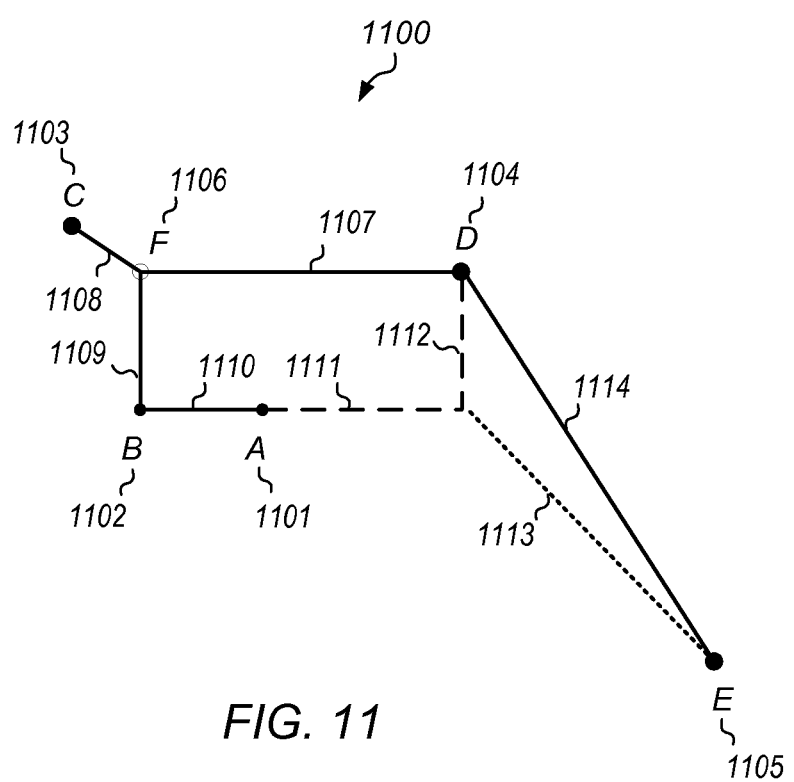
FIG. 11 illustrates an embodiment of a graph of a route with a non-optimal solution.

Turning to FIG. 11, an embodiment of a graph is illustrated that may be representative of a route in network 114 of IC 100 in FIG. 1. Unlike the previous embodiments of graphs considered, an initial route has been completed on the graph 1100 and a spanning tree has been identified. The embodiment includes terminal nodes A 1101, B 1102, C 1103, D 1104, and E 1105. Steiner node F 1106 is also included in the embodiment. In the illustrated embodiment, edges 1107, 1108, 1109, 1110, and 1114 have been identified as an edge set that forms a spanning tree for the graph. It may be possible, however, that the identified edges may not be an optimal solution due to the order in which the RSMT algorithm illustrated in the flowchart depicted in FIG. 8 analyzes nodes and edges of a graph. In some embodiments, edges 1107 and 1114 may be replaced with edges 1111, 1112, and 1113 to provide an optimal solution. It is noted that in some embodiments, other configurations of nodes and edges may also result in the algorithm detecting a non-optimal, i.e., there exists a spanning tree with a smaller total distance, spanning tree.

Figure 12:
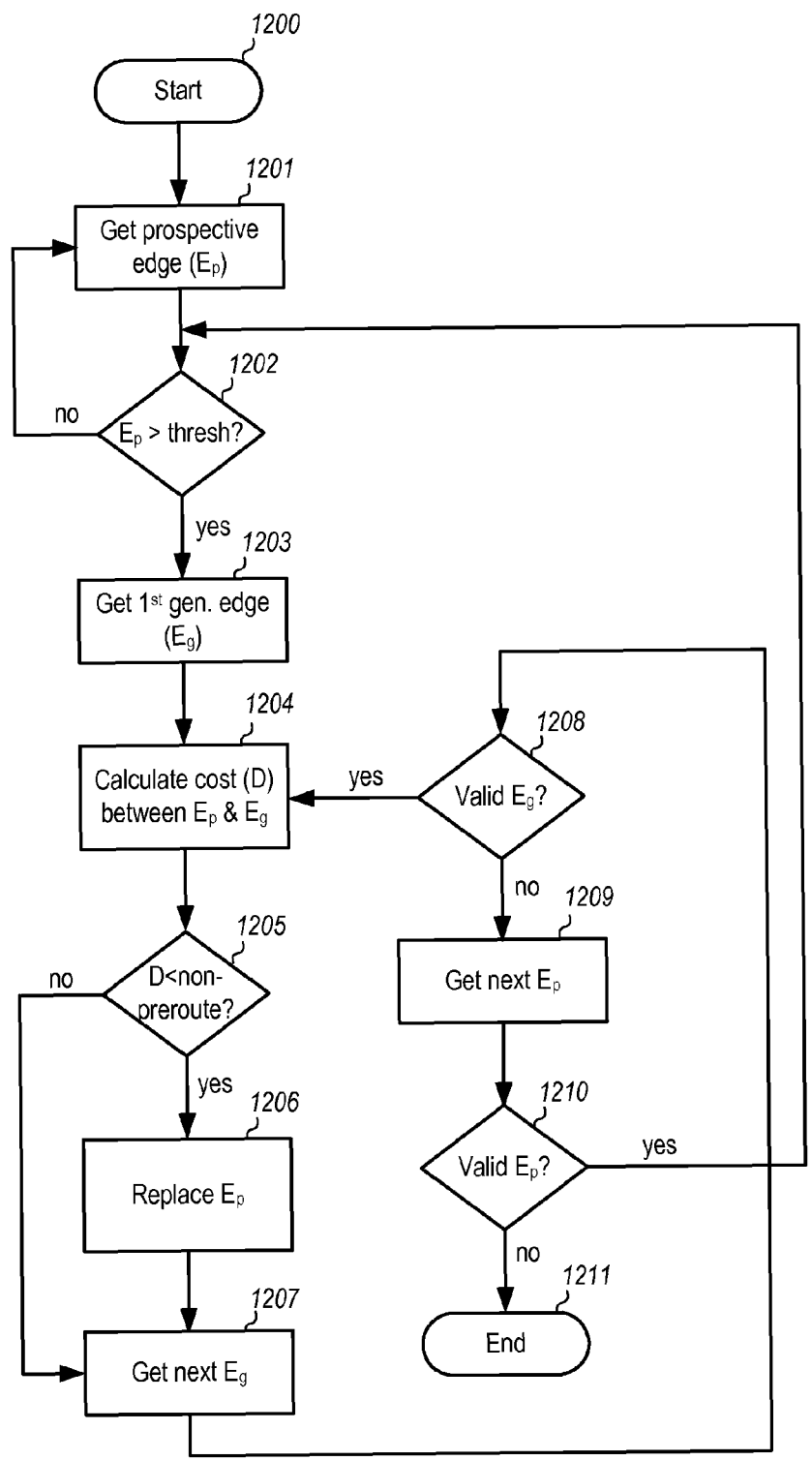
FIG. 12 illustrates an embodiment of an algorithm to post-process the results created by the algorithm depicted in FIG. 8.

An embodiment of a post-processing algorithm to compensate for non-optimal spanning trees is illustrated in FIG. 12. The operation begins in block 1200. A prospective edge ($E_p$) is then selected (block 1201). The operation then depends upon the result of a comparison between the selected edge $E_p$ and a threshold value (block 1202). When the selected edge $E_p$ is less than or equal to the threshold value, a new edge is selected (block 1201).

When the selected edge $E_p$ is greater than the threshold value, a previously generated edge is selected ($E_g$) (block 1203) and a cost D between $E_p$ and $E_g$ is calculated (block 1204). The operation then depends on a comparison between the cost D and any pre-route cost along a path determined by $E_p$ and $E_g$ (block 1205). When the cost D is greater than or equal to any non-pre-route cost on the current path, an attempt is made to select the next generated edge (block 1207). When the cost D is less than any non-pre-route cost on the current path, then the prospective edge $E_p$ is replaced (block 1206) and then an attempt is made to select the next generated edge (block 1207). The operation then depends on the result of the attempt to select the next generated edge (block 1208).

When a valid edge is returned, a new cost is calculated between $E_p$ and newly selected generated edge is calculated (block 1204). When no valid edge is returned, an attempt is made to select a new perspective edge (block 1209). The operation then depends on the result of the attempt to select the next perspective edge (block 1210). When a valid perspective edge is returned, the new perspective edge is checked against the threshold value (block 1202). When no valid perspective edge is returned, the operation ends (block 1211). It is noted that other operations or the ordering of operations to post-process spanning trees may be possible in other embodiments.

Figure 13:
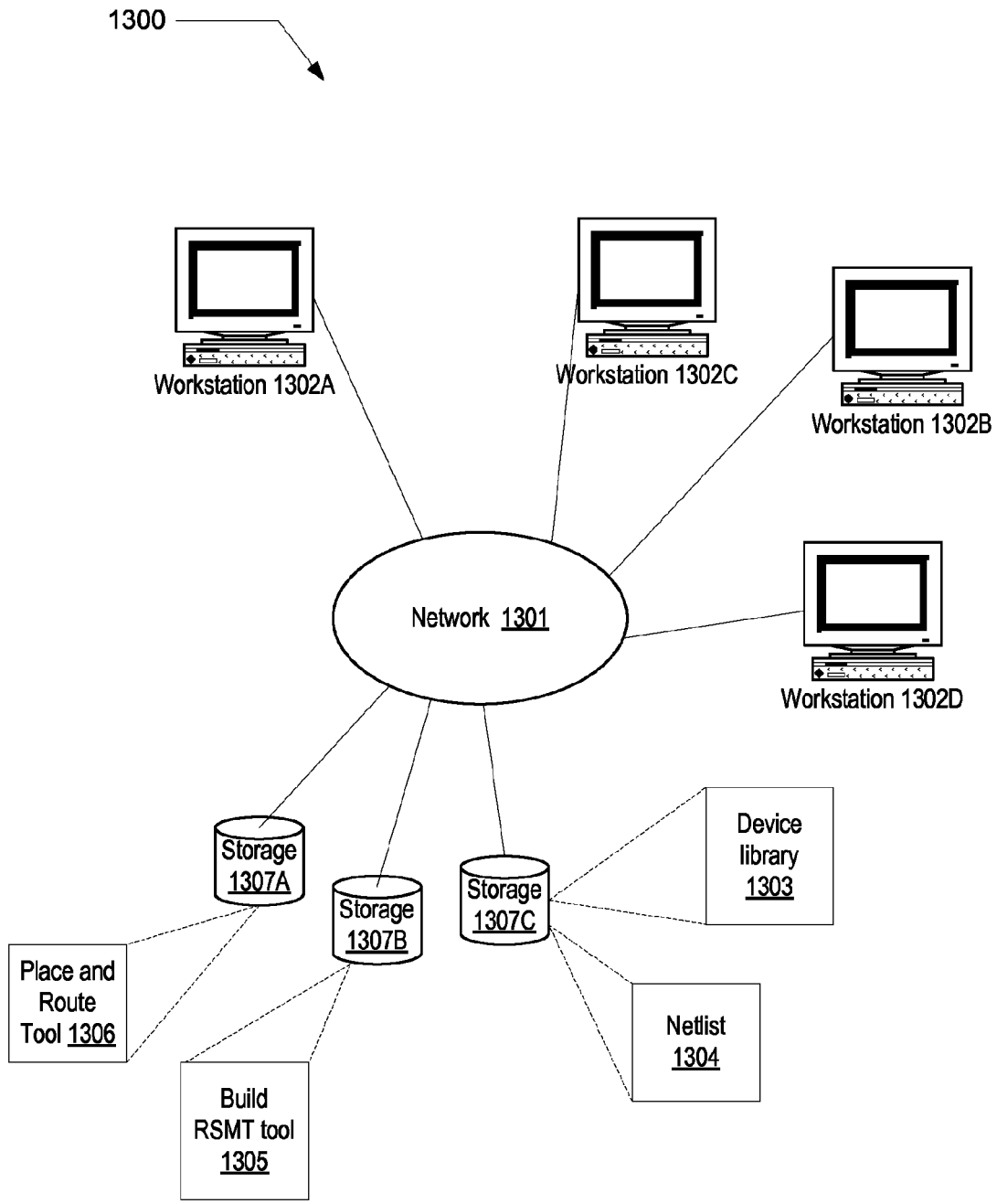
FIG. 13 is a block diagram of one embodiment of a computer system including an integrated circuit design tool that implements the Build rectilinear Steiner minimum tree algorithm of FIG. 8.

Turning to FIG. 13, a block diagram of one embodiment of a computer system including an integrated circuit design tool. The computer system 1300 includes a plurality of workstations designated 1302A through 1302D. The workstations are coupled together through a network 1301 and to a plurality of storages designated 1307A through 1307C. In one embodiment, each of workstations 1302A-1302D may be representative of any standalone computing platform that may include, for example, one or more processors, local system memory including any type of random access memory (RAM) device, monitor, input output (I/O) means such as a network connection, mouse, keyboard, monitor, and the like (many of which are not shown for simplicity).

In one embodiment, storages 1307A-1307C may be representative of any type of mass storage device such as hard disk systems, optical media drives, tape drives, ram disk storage, and the like. As such, program instructions comprising the design tools such as the Build RSMT algorithm tool may be stored within any of storages 1307A-1307C and loaded into the local system memory of any of the workstations during execution. As an example, as shown in FIG. 13, the place and route tool 1306, is shown stored within storage 1307A, while the netlist 1304 and the device library 1303 are stored within storage 1307C. Further, the Build RSMT algorithm tool 1305 is stored within storage 1307B. In one embodiment, the Build RSMT algorithm tool 1305 may be called by the place and route tool 1306 either manually with user intervention, or automatically using additional program instructions such as scripting instructions. Additionally, the program instructions may be stored on a portable/removable storage media. The program instructions may be executed directly from the removable media or transferred to the local system memory or mass storages 1307 for subsequent execution. As such, the portable storage media, the local system memory, and the mass storages may be referred to as non-transitory computer readable storage mediums. The program instructions may be executed by the one or more processors on a given workstation or they may be executed in a distributed fashion among the workstations, as desired.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A non-transitory computer-accessible storage medium having program instructions stored therein that, in response to execution by a computer system, causes the computer system to perform operations comprising:
   receiving a plurality of terminal nodes, each corresponding to a vertex of a signal route of an integrated circuit;
   receiving one or more pre-routed edges, each corresponding to a pre-determined connection between a given terminal node of the plurality of terminal nodes and another terminal node of the plurality of terminal nodes;
   determining one or more candidate connections between a particular point on each pre-routed edge and any remaining terminal nodes of the plurality of terminal nodes;
   determining a connection distance for each of the one or more candidate connections;
   storing in a respective one of a plurality of node heaps, each candidate connection having a connection distance that is less than a respective one of a plurality of pre-determined threshold distances, wherein each node heap corresponds to a respective node of the remaining terminal nodes, and wherein each pre-determined threshold distance corresponds to a respective node of the remaining terminal nodes;

forming a minimum Steiner tree, wherein the minimum Steiner tree includes a minimum candidate connection from each node heap of the plurality of node heaps.

2. The non-transitory computer-accessible storage medium of claim 1, wherein the connection distance is a rectilinear distance between the particular point on each pre-routed edge and any remaining terminal nodes.

3. The non-transitory computer-accessible storage medium of claim 1, wherein the operations further include updating, in response to determining that a given candidate connection is unaffected by any remaining candidate connections, the respective one of the plurality of pre-determined threshold distances to be equal to the connection distance of the given candidate connection.

4. The non-transitory computer-accessible storage medium of claim 1, wherein the operations further include creating manufacturing mask design data for the signal route using the minimum Steiner tree, wherein the manufacturing mask data is used to create a photomask used during the manufacture of an integrated circuit.

5. The non-transitory computer-accessible storage medium of claim 1, wherein the minimum candidate connection from each node heap is the candidate connection with the smallest connection distance.

6. The non-transitory computer-accessible storage medium of claim 1, wherein the operations further include replacing a minimum candidate connection of the minimum Steiner tree that has a connection distance larger than a pre-determined maximum distance with a remaining candidate connection.

7. A method comprising:
performing by one or more computers:
receiving a set of nodes, each node corresponding to a vertex of a signal route of an integrated circuit;
receiving a set of pre-routed edges, each pre-route edge corresponding to a pre-determined connection between a node of the set of nodes and another node of the set of nodes;
determining a set of spanning connections between a particular point on each pre-routed edge of the set of pre-routed edges and any remaining nodes in the set of nodes;
calculating a connection cost for each spanning connection of the set of spanning connections;
adding in a respective one of a plurality of node lists, each candidate connection having a connection cost that is less than a respective one of a plurality of pre-determined threshold costs, wherein each node list corresponds to a respective node of the remaining nodes, and wherein each pre-determined threshold cost corresponds to a respective node of the remaining nodes;
forming a minimum Steiner tree, wherein the minimum Steiner tree includes a minimum spanning connection from each node list of the set of node lists.

8. The method of claim 7, wherein the connection cost includes a rectilinear distance between the particular point on each pre-routed edge and any remaining nodes.

9. The method of claim 7, wherein the connection cost includes a route congestion factor.

10. The method of claim 7, wherein the performing further includes generating manufacturing mask design data for the signal route using the minimum Steiner tree, wherein the manufacturing mask data is used to create a photomask used during the manufacture of an integrated circuit.

11. The method of claim 7, wherein the performing further includes replacing a minimum spanning connection of the minimum Steiner tree that has a connection cost larger than a pre-determined maximum cost with a remaining candidate connection.

12. The method of claim 7, wherein each pre-routed edge has a connection cost of zero.

13. The method of claim 7, wherein the performing further includes determining that a given spanning connection of the set of spanning connections is unaffected by any remaining spanning connection of the set of spanning connections.

14. The method of claim 13, wherein the performing further includes updating the respective one of the plurality of pre-determined threshold costs to be equal to the connection cost of the given spanning connection.

15. A non-transitory computer-accessible storage medium having program instructions stored therein that, in response to execution by a computer system, causes the computer system to perform operations comprising:
receiving a plurality of terminal nodes, each corresponding to a vertex of a signal route of an integrated circuit;
receiving one or more pre-routed edges, each corresponding to a pre-determined portion of a path of the signal route;
determining one or more candidate connections between a particular point on each pre-routed edge and one of the plurality of terminal nodes;
determining a connection cost for each of the one or more candidate connections;
storing in a respective one of a plurality of node heaps, each candidate connection having a connection cost that is less than a respective one of a plurality of pre-determined threshold costs, wherein each node heap corresponds to a respective node of the remaining terminal nodes, and wherein each pre-determined threshold cost corresponds to a respective node of the remaining terminal nodes;
forming a minimum Steiner tree, wherein the minimum Steiner tree includes a minimum candidate connection from each node heap of the plurality of node heaps.

16. A system comprising:
one or more memories configured to, store instructions, and
one or more processors configured to, execute the instructions and to cause the system to:
receive a set of vertices of a signal route of an integrated circuit;
receive one or more pre-routed edges, each corresponding to a pre-determined connection between a given vertex of the set of vertices and another vertex of the set of vertices;
determine one or more candidate connections between a particular point on each pre-routed edge and any remaining vertices of the set of vertices;
calculate a connection distance for each of the one or more candidate connections;
store in a respective one of a plurality of node heaps, each candidate connection having a connection distance that is less than a respective one of a plurality of pre-determined threshold distances, wherein each node heap corresponds to a respective vertex of the remaining vertices, and wherein each pre-determined threshold distance corresponds to a respective vertex of the remaining vertices;

form a minimum Steiner tree, wherein the minimum Steiner tree includes a minimum candidate connection from each node heap of the plurality of node heaps.

17. The system of claim 16, wherein the connection distance includes a rectilinear distance between the particular point on each pre-routed edge and any remaining vertices.

18. The system of claim 16, wherein the one or more processors are configured to execute the instructions to cause the system to generate manufacturing mask design data for the signal route using the minimum Steiner tree, wherein the manufacturing mask data is used to create a photomask used during the manufacture of an integrated circuit.

19. The system of claim 16, wherein the one or more processors are configured to execute the instructions to cause the system to replace a minimum candidate connection of the minimum Steiner tree having a connection distance that is larger than a pre-determined maximum distance with a remaining candidate connection.

20. The system of claim 16, wherein the one or more processors are configured to execute the instructions to cause the system to update, in response to determining a given candidate connection of the one or more candidate connections is unaffected by any remaining candidate connections, the respective one of the plurality of pre-determined threshold distances to be equal to the connection distance of the given one of the given candidate connection.

21. The system of claim 16, wherein the minimum candidate connection from each node heap is the candidate connection with the smallest connection distance.

* * * * *

UNITED STATES PATENT AND TRADEMARK OFFICE
CERTIFICATE OF CORRECTION

| | |
|---|---|
| PATENT NO. | : 8,635,576 B2 |
| APPLICATION NO. | : 13/486061 |
| DATED | : January 21, 2014 |
| INVENTOR(S) | : Zhao et al. |

It is certified that error appears in the above-identified patent and that said Letters Patent is hereby corrected as shown below:

In the Specification

In column 9, line 2, delete "by" and insert -- be --, therefor.

Signed and Sealed this
Twenty-fourth Day of June, 2014

Michelle K. Lee
*Deputy Director of the United States Patent and Trademark Office*